(12) United States Patent
Van Rijs et al.

(10) Patent No.: US 6,355,972 B1
(45) Date of Patent: Mar. 12, 2002

(54) SEMICONDUCTOR DEVICE AND METHOD OF MANUFACTURING SAME

(75) Inventors: Freerk Van Rijs, Nijmegen; Ronald Dekker; Dave Michel Henrique Hartskeerl, both of Eindhoven, all of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/585,826

(22) Filed: Jun. 1, 2000

(30) Foreign Application Priority Data

Jun. 3, 1999 (EP) .............................. 99201759

(51) Int. Cl.$^7$ ............................................... H01L 29/70
(52) U.S. Cl. ...................... 257/586; 257/587; 257/593
(58) Field of Search ................... 257/586, 587, 257/593

(56) References Cited

U.S. PATENT DOCUMENTS

| | | | | |
|---|---|---|---|---|
| 3,590,479 A | * | 7/1971 | Devries ....................... | 257/586 |
| 5,629,554 A | * | 5/1997 | Maas et al. ................. | 257/586 |
| 5,753,537 A | | 5/1998 | Dekker et al. .............. | 257/522 |

FOREIGN PATENT DOCUMENTS

WO        9603772 A2    2/1996

OTHER PUBLICATIONS

"Transmission Line Design Handbook" by Brian C. Wadell, Artech House, Inc. 1991, Chapter 3.4, pp. 73–77.

\* cited by examiner

*Primary Examiner*—Gene M. Munson
(74) *Attorney, Agent, or Firm*—Steven R. Biren

(57) ABSTRACT

The invention relates to a semiconductor device comprising a bipolar transistor having a collector (1), a base (2) and an emitter (3) at its active area (A). The semiconductor body (10) of the device is covered with an insulating layer (20). At least a part of a base connection conductor (5) and an emitter connection conductor (6) extend over the insulating layer (20) and lead to a base connection area (8) and an emitter connection area (9), respectively. The known transistor is characterized by poor gain, particularly at high frequencies and at high power. A device according to the invention is characterized in that the emitter connection area (8) and the base connection area (9), viewed in projection, are present on the same side of the active area (A), the emitter connection conductor (6) is divided into two or more sub-conductors (6A, 6B) and the base connection conductor (5) is divided into one or more further sub-conductors (5) which are present between the sub-conductors (6A, 6B) and form a co-planar transmission line (T) therewith. In this way, the inductance of the emitter connection conductor (6) is reduced considerably, resulting in a much higher gain, particularly at high frequencies and high power. Preferably, the semiconductor body (A) is interrupted at the area of the transmission line (T) and is glued to an insulating substrate (40).

7 Claims, 2 Drawing Sheets

SEMICONDUCTOR DEVICE AND METHOD OF MANUFACTURING SAME

BACKGROUND OF THE INVENTION

The invention relates to a semiconductor device comprising a semiconductor body the surface of which is provided with an insulating layer and which includes a first semiconductor region of a first conductivity type, a second semiconductor region which adjoins the first semiconductor region and which is of a second, opposite conductivity type, and a third semiconductor region of the first conductivity type, which adjoins the second semiconductor region, which semiconductor regions form, at the location of an active region, respectively, a collector region, a base region and an emitter region of a bipolar transistor, and which are provided, respectively, with a first, a second and a third connection conductor connecting, respectively, the collector region, the base region and the emitter region to respectively a first, a second and a third connection region, with at least the second and the third connection conductor extending over the insulating layer. The invention also relates to a method of manufacturing such a device.

Such a device is used, for example, as a bipolar transistor, inter alia, as an amplifier, more particularly a power amplifier.

Such a device is known from the international patent specification WO 96/03772, published on Feb. 8, 1996. In said document, a bipolar NPN transistor is shown comprising an active region in a semiconductor body, the transistor including an n-type collector region, a p-type base region and an n-type emitter region at the location of said active region. Connection conductors for the base and the emitter extend over the semiconductor body covered with an insulating layer, said connection conductors connecting these regions to a connection region for, respectively, the base and the emitter. These connection regions, as well as the active region of the transistor, are formed by mesa-shaped parts of the semiconductor body. Partly as a result thereof, the device can very suitably be used as a so-called SMD (=Surface Mounted Device).

A drawback of the known device resides in that its gain is too small sometimes, particularly at high frequencies and for amplifying high powers.

SUMMARY OF THE INVENTION

Therefore, it is an object of the invention to provide a device wherein this drawback is obviated or at least partly obviated, and which device provides a high gain, particularly in the case of comparatively high powers, also at high frequencies. A further aim is to provide a simple method of manufacturing such a device.

To achieve this, a device of the type mentioned in the opening paragraph is characterized in accordance with the invention in that the second and the third connection region are situated, viewed in projection, on the same side of the active region of the transistor, the third connection conductor is divided into two or more strip-shaped sub-conductors and the second connection conductor is divided into one or more strip-shaped further sub-conductors which are situated between the sub-conductors and form a co-planar transmission line therewith.

The invention is based, first and foremost, on the recognition that the gain of the known transistor, particularly at high powers, is limited because the contribution of the emitter conductor track to the emitter inductance is not negligibly small, particularly as a result of the relatively large distance between the active region of the transistor and the emitter contact region. By dividing the emitter conductor track into two or more sub-tracks and positioning these sub-tracks on either side of the base conductor track, a co-planar transmission line is formed, during operation of the transistor, between the active region and the emitter connection region by the emitter and the base conductor tracks. As a result, the effective emitter inductance is reduced, enabling a substantially higher gain to be achieved. Very favorable results are already achieved when the emitter conductor track is divided into two sub-tracks. If necessary, use can be advantageously made of a further division of the emitter conductor track. In that case, also the base conductor track is divided, so that a base subconductor track is present between every two emitter subconductor tracks. The invention is also based on the recognitions that a division of the emitter conductor track is not disadvantageous because the subdivisions are capable of (jointly) carrying a sufficiently high current at the appropriate dimensions for a (co-planar) transmission line. In addition, a (possible) division of the base conductor track is favorable if the device comprises a plurality of active regions. In that case, the capacitance of the base conductor track (tracks) is relatively low.

A further, very important advantage of the device in accordance with the invention resides in that the transmission line used is co-planar. By virtue thereof, the transmission line can be formed in a single metal layer, so that both the manufacture and the device itself can be very simple.

In a preferred embodiment of a device in accordance with the invention, the third connection region is situated, viewed in projection, between the active region and the second connection region. On the one hand, the entire emitter-conductor track forms part, in this case, of the transmission line. On the other hand, the order of the connection regions in this embodiment, i.e. collector, emitter, base, is compatible with the customary order of connecting in, particularly, power modules. This is an additional advantage.

In a favorable modification, the third connection region is interrupted at the location of the further sub-conductor. By virtue thereof, a low-loss transmission line can be achieved.

Another favorable embodiment is characterized in that the third connection region is divided into two or more sub-regions, and the second connection region is divided into one or more further sub-regions situated between the sub-regions. Also this embodiment enables a low-loss transmission line to be achieved. In addition, this modification is extremely compact, yielding important additional advantages, such as a low capacitance of the base-conductor track and a high packing density of transistors.

In favorable modifications, it more generally applies that the semiconductor body is interrupted at the location of the second and the third connection conductor or it is so far removed from the second and the third connection conductor that the losses of the transmission line are minimal.

In a further important embodiment, the semiconductor body is attached, by means of an adhesive layer, to an insulating substrate and comprises at least three mesa-shaped parts which comprise, respectively, the active region and the first connection region, the second connection region and the third connection region. This modification yields a transmission line having particularly low losses since the semiconductor body is interrupted at the proper locations and the insulating substrate does not give rise to an increase of the losses. In addition, the transistor is very suitable for SMD mounting.

A method of manufacturing a semiconductor device in accordance with the invention, wherein a semiconductor body is covered with an insulating layer and provided with a first semiconductor region of a first conductivity type, a second semiconductor region of a second, opposite conductivity type, which adjoins the first semiconductor region, and a third semiconductor region of the second conductivity type, which adjoins the second semiconductor region, which semiconductor regions form, at the location of an active region, respectively, a collector region, a base region and an emitter region of a bipolar transistor, and which are provided with, respectively, a first, a second and a third connection conductor with which, respectively, the collector region, the base region and the emitter region are connected to, respectively, a first, a second and a third connection region, at least the second and the third connection conductor being provided on the insulating layer, which method is characterized in that the second and the third connection region are formed, viewed in projection, on the same side of the active region of the transistor, the third connection conductor is divided into two or more strip-shaped sub-conductors and the second connection conductor is subdivided into one or more strip-shaped further sub-conductors which are provided between the sub-conductors with which a co-planar transmission line is formed. Such a method enables a device in accordance with the invention to be achieved in a very simple manner.

Preferably, the third connection region is formed, viewed in projection, between the active region and the second connection region. In an important embodiment, the semiconductor body is interrupted at the location of the second and the third connection conductor or is formed at such a distance from the second and the third connection conductor that the losses of the transmission line are minimal. In a very favorable modification, the semiconductor body is attached, after the formation of the transistor, to an insulating substrate by means of an adhesive layer, whereafter three mesa-shaped parts are formed by locally removing parts of the semiconductor body, which mesa-shaped parts comprise, respectively, the active region and the first connection region, the second connection region and the third connection region.

These and other aspects of the invention will be apparent from and elucidated with reference to the embodiments described hereinafter.

In the drawings:

Figure 1:
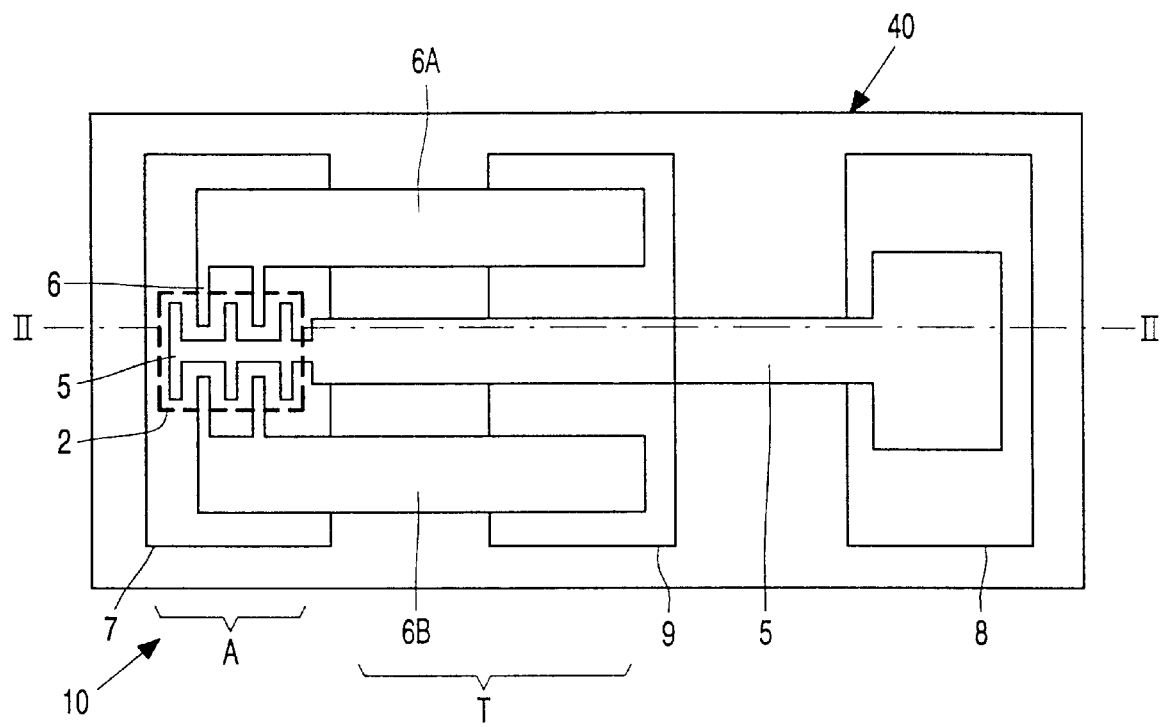
FIG. 1 diagrammatically shows a plan view of a first embodiment of a semiconductor body in accordance with the invention.

The Figures are diagrammatic and not drawn to scale, and particularly the dimensions in the thickness direction are exaggerated strongly for clarity. In general, semiconductor regions of the same conductivity type are hatched in the same direction. Like reference numerals refer to like parts whenever possible.

DESCRIPTION OF THE PREFERRED EMBODIMENT

Figure 2:
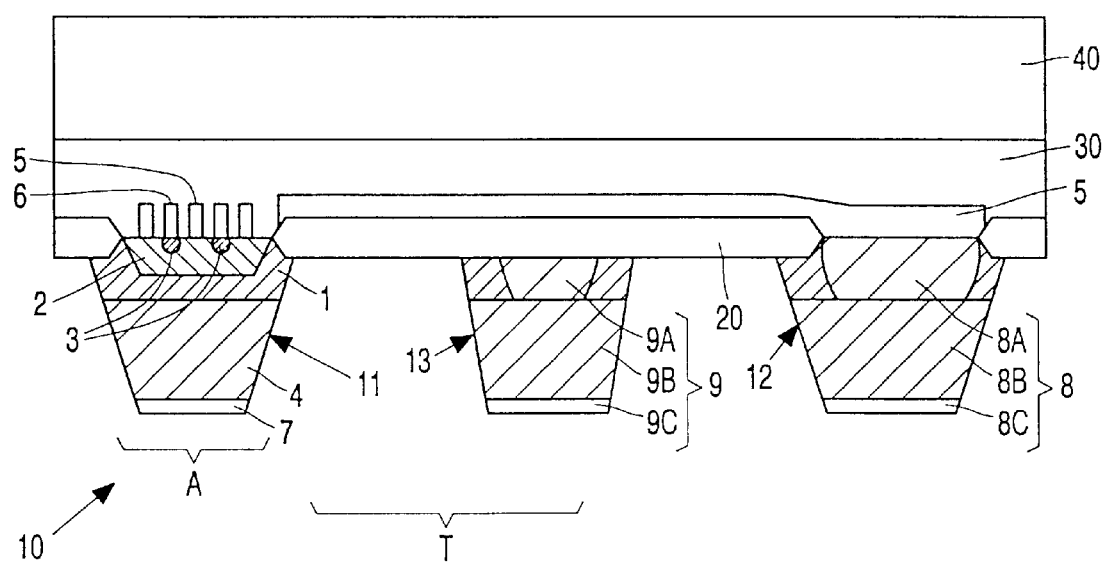
FIG. 2 is a diagrammatic, cross-sectional view, at right angles to the thickness direction and taken on the line II—II, of the device shown in FIG. 1.

FIG. 1 is a diagrammatic, plan view of a first embodiment of a semiconductor device in accordance with the invention and FIG. 2 is a diagrammatic, cross-sectional view, at right angles to the thickness direction and taken on the line II—II, of the device shown in FIG. 1. The device comprises (see FIG. 2) a semiconductor body 10 which includes three mesa-shaped semiconductor parts 11, 12, 13 of silicon. The first mesa-shaped part 11 comprises the active region A of a bipolar, here NPN, transistor having a collector region 1, a base region 2 and an emitter region 3. The first mesa-shaped part 11 also includes a collector-connection region 7 which is connected to the collector region 1 by means of a first connection conductor 4, which in this case is made of highly doped silicon. Above the mesa-shaped parts 11, 12, 13 there is an insulating layer 20 of silicon dioxide. Above said layer there is a second and a third connection conductor 5, 6 via which, respectively, the base region 2 is connected to a base-connection region 8 and the emitter region 3 is connected to an emitter-connection region 9, said connection regions 8, 9 corresponding to the second and the third mesa-shaped part 12, 13.

In accordance with the invention, the second connection region 8 and the third connection region 9 are situated, viewed in projection, on the same side of the active region A of the transistor, the third connection conductor 6 is divided into two or more, here two, strip-shaped sub-conductors 6A, 6B, and the second connection conductor 5 is divided into one or more, here one, strip-shaped, further sub-conductor 5 situated between the sub-conductors 6A, 6B and forming a co-planar transmission line T therewith. Unlike the known device, the device in accordance with the invention has a very high gain, particularly also at high frequencies and high powers. The invention is based on the recognition that the relevant characteristic of the known device is not optimal as a result of a high inductance of the third connection conductor 6, which is caused by the relatively large distance over which this connection conductor extends over the insulating layer 20. This can be illustrated by means of the formula $g=1/(\omega^2 * C_{bc} * I_E)$, wherein g is the gain, $\omega$ is $2\pi f$ (f is the frequency), $C_{bc}$ is the capacitance of the base collector transition, and IE is the emitter inductance. For an emitter conductor track, the last-mentioned quantity is, for example, 1 nH/mm, the length of a typical conductor track is approximately 2 mm, $C_{bc}$ is, for example, 2 pF and f is, for example, 1 GHz. This results in a gain g of approximately 7. By dividing the second connection conductor 5 and in any case the third connection conductor 6, and alternating them with each other, this relatively high inductance can be compensated for because a transmission line T has thus been formed. As a result, the device has a high gain also at high frequencies. There is no drawback attached to dividing the third connection conductor 6 because, at sufficiently wide sub-conductors, still enough current can flow through this conductor 6, even when it is used for power gain.

In addition, division of the second connection conductor 5 has the advantage, particularly if the device comprises a plurality of active regions, that the capacitance of this conductor 5 is also relatively low, which further improves the high-frequency properties. A very important additional advantage of a device in accordance with the invention resides in that it can be manufactured very readily by virtue of the fact that the transmission line T formed is co-planar: this enables said transmission line to be formed in a single metal (conductor) layer 5, 6, so that a so-called multi(metal) layer process, which is complicated, can be omitted. A further very favorable property of a device in accordance with the invention is that the collector connection region 7, emitter connection region 9, and base connection region 8 are juxtaposed in this order because this order is compatible, particularly in power applications, with customarily used housings.

In this example, the emitter region 3, and at the location thereof, the third connection conductor 6 as well as the second connection conductor 5 have a comb-shaped structure. Both comb-shaped structures mesh together. This has the advantage that, as a result thereof, the device has a low base resistance and a crown-shaped profile of the current is precluded. Besides, the orientation of both comb-shaped structures is such that the longitudinal direction of the teeth of the comb extends substantially perpendicularly to the longitudinal direction of the transmission line T. This has the advantage that the device in accordance with the invention can be extremely compact. In addition, there is less electromagnetic coupling between the conductor tracks and the comb-shaped structure. Finally, this results in a symmetrical drive of the device, as a result of which parts of a comb-shaped structure do not counteract each other.

As a result of the fact that, in this example, the semiconductor body 10 is interrupted at the location of the transmission line T, said transmission line T can exhibit a very low loss. In this example, the semiconductor body 10 is supported, in fact, by an insulating substrate 40 which is connected to the semiconductor body 10 by means of an adhesive layer 30. This too makes it possible to obtain a low-loss transmission line T. For designing a low-loss transmission line T and for estimating the favorable influence thereof on the inductance of the third connection conductor 6, use can be made of the knowledge available in the field of transmission lines. Here, reference is only made to the book entitled "Transmission Line Design Handbook" by Brian C. Wadell, published by Artech House, Inc. in 1991, and in particular to, for example, chapter 3.4 on page 73 ff.

The dimensions of the device in this example are: the mesa-shaped parts 11, 12, 13 have a width of 200 μm, a length of 500 μm and a height of 200 μm, and are 250 μm spaced apart. By virtue of the mesa-shaped parts 11, 12, 13, the device in accordance with the invention can very suitably be used for so-called SMD mounting. In this case, the width of the second connection conductor 5 is 75 μm, and the distance between said second connection conductor and the juxtaposed sub-conductors 6A, 6B, whose width, in this case, is twice that of the second connection conductor 5, is 50 μm. The transmission line T is sufficiently characterized by means of the above dimensions. The other dimensions of the transistor as well as the doping concentrations of the different semiconductor regions are, for example, equal to those of the known transistor.

Figure 3:
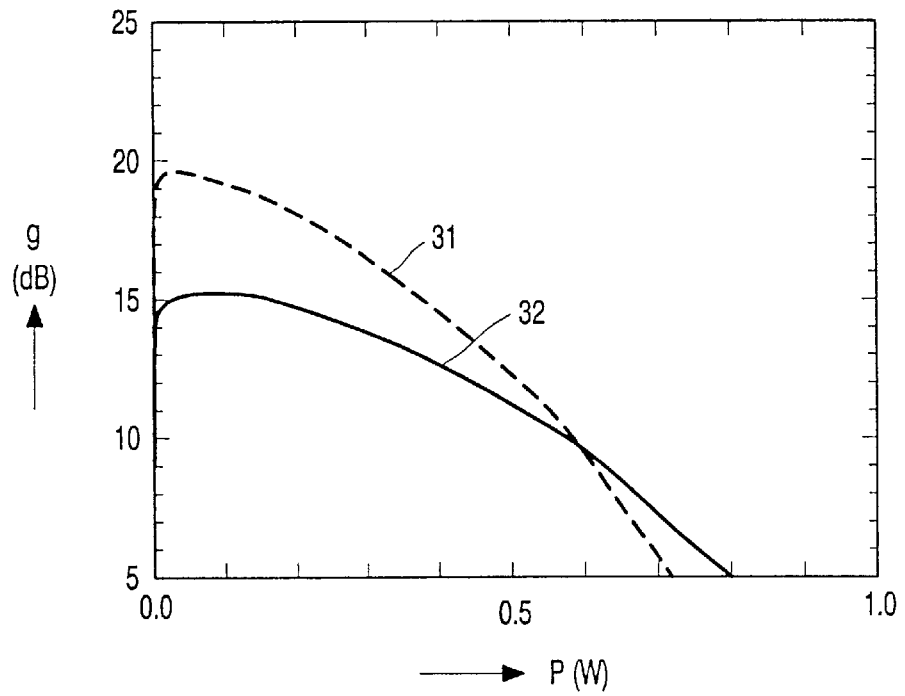
FIG. 3 shows the gain (g) as a function of the power (P) of a device in accordance with the invention and, for comparison, the same characteristic for a known device.

FIG. 3 shows, in curve 31, the gain (g) as a function of the power (P) of a device in accordance with the invention and, for comparison, in curve 32, the same characteristic for a known device. The curves relate to the behavior at a frequency of 1.8 GHz. The important improvement brought about by the measures in accordance with the invention is very obvious. Substantially throughout the power range P under consideration, the gain of a device in accordance with the invention is higher or substantially higher than that of the known device.

The device of this example is manufactured as will be described hereinbelow, using a method in accordance with the invention. An n-type silicon substrate 4 is provided with an n-type epitaxial layer 1. The resultant semiconductor body 10 is provided with a thermal oxide layer 20 which is provided with an opening by means of photolithography and etching at the location of the second and third mesa-shaped parts 12, 13 to be formed, through which opening the parts 8A and 9A of, respectively, the second and the third connection region 8, 9 are formed by means of an n-type diffusion which reaches as far as the substrate 4. Subsequently, using standard techniques which are known per se such as oxidation, implantation and diffusion, LOCOS (=Local Oxidation of Silicon) regions, the p-type base region 2, a comb-shaped base contact region, not shown, and the n-type emitter region 3 are formed. Subsequently, a conductive layer 5, 6, such as a Ti/Pt/Au layer 5, 6 having a thickness of 1.1 μm is applied, for example, by means of sputtering to the insulating layer 20. By means of photolithography and etching, this layer 5, 6 is given the pattern shown in FIG. 1, resulting, on the one hand, in the base region 2, or rather the above-mentioned base contact region, and the emitter region 3 being connected to their connection regions 8, 9, and, on the other hand, in the formation of the transmission line T. Said patterned metal layer 5, 6 is provided with a scratch-resistant layer of silicon nitride, which is not shown either in the drawing.

Subsequently, the semiconductor body 10 is provided with an UV-curing adhesive layer 30 containing, in this case, a hexanedioldiacrylate glue, and with an insulating substrate 40, here an 1 mm thick plate 40 of Pyrex glass, through which the glue is cured by exposure to UV radiation. Next, the thickness of the substrate 4 is reduced to 200 μm by means of, for example, a grinding process. Subsequently, the bottom side of the semiconductor body 10 is also covered with, for example, a metal layer 7, 8C, 9C containing, for example, Ti/Pt/Au and/or PbSn/Cu/Au with a view to mounting by means of soldering. This metal layer 7, 8C, 9C is patterned by means of photolithography and etching, whereafter the semiconductor body 10 is locally removed by means of etching using a KOH-containing solution, thereby forming the mesa-shaped parts 11, 12, 13. By means of, for example, wire sawing an individual device in accordance with the invention is finally obtained which is suitable for SMD mounting. For further particulars, reference is also made to the manufacturing process as described in the above-mentioned patent publication WO 96/03772.

Figure 4:
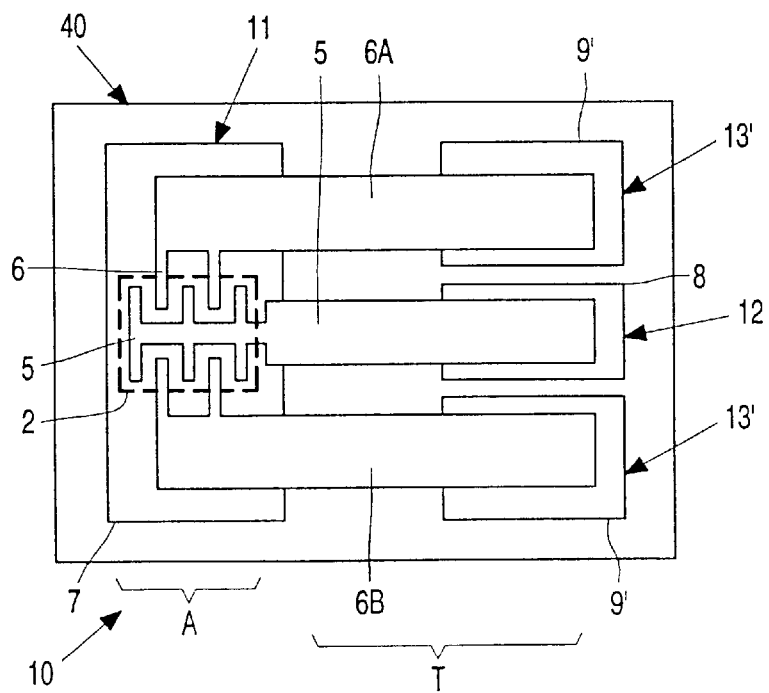
FIG. 4 is a diagrammatic, cross-sectional view, at right angles to the thickness direction, of a second embodiment of a device in accordance with the invention.

Finally, FIG. 4 is a diagrammatic, cross-sectional view at right angles to the thickness direction, of a second embodiment of a device in accordance with the invention. In this example, the emitter connection region 9 is divided into two parts 9', which correspond to two mesa-shaped parts 13' of the semiconductor body 10. These mesa-shaped parts 13' are situated on either side of the base connection region 8 which corresponds to the mesa-shaped part 13 of the semiconductor body 10. This embodiment is very compact and also enables the formation of a low-loss transmission line T to be more readily achieved. The manufacture of the device of this example is analogous to the manufacture of the device of the first example described hereinabove.

The invention is not limited to the above examples because, within the scope of the invention, many variations and modifications are possible to those skilled in the art. For example, compositions and thicknesses for the different (semiconductor) regions or layers can be chosen to be different from those mentioned herein. The invention is not limited to SMD or discrete transistors. Application within a CMOS or BICMOS technology is also possible. It is noted again that in order to obtain a low-loss transmission line, neither local interruption nor securing of the semiconductor body to an insulating substrate are necessary. Application in a (purely) epitaxial transistor is also possible. Another possible technique, wherein a thick insulating layer is present between the transmission line and a semiconductor substrate, employs a thick dielectric synthetic resin layer on which the metal layer necessary to form the transmission line is present. The invention can more generally also be applied in so-called multilayer metal processes. In that case, the transmission line can be formed in the uppermost, for example the eighth, metal layer. In these cases, air is present above the transmission line. Grinding back the substrate and gluing it to a glass plate are not necessary. The comb-shaped structure of the emitter region, the base contact region and the base connection conductor, which serves to obtain a high permissible power is not necessary either. If these comb-shaped structures are used, they may also be oriented in a direction parallel to the transmission line instead of perpendicular to said transmission line.

What is claimed is:

1. A semiconductor device comprising a semiconductor body (10) the surface of which is provided with an insulating layer (20) and which includes a first semiconductor region (1) of a first conductivity type, a second semiconductor region (2) which adjoins the first semiconductor region and which is of a second, opposite conductivity type, and a third semiconductor region (3) of the first conductivity type, which adjoins the second semiconductor region, which semiconductor regions form, at the location of an active region (A), respectively, a collector region (1), a base region (2) and an emitter region (3) of a bipolar transistor, and which are provided, respectively, with a first, a second and a third connection conductor (4, 5, 6) connecting, respectively, the collector region (1), the base region (2) and the emitter region (3) to respectively, a first, a second and a third connection region (7, 8, 9), with at least the second and the third connection conductor (5, 6) extending over the insulating layer (20), characterized in that the second and the third connection region (8, 9) are situated, viewed in projection, on the same side of the active region (A) of the transistor, the third connection conductor (6) is divided into two or more strip-shaped sub-conductors (6A, 6B) and the second connection conductor (5) is divided into one or more strip-shaped further sub-conductors (5) which are situated between the sub-conductors (6A, 6B) and form a co-planar transmission line (T) therewith.

2. A semiconductor device as claimed in claim 1, characterized in that the third connection region (9) is situated, viewed in projection, between the active region (A) and the second connection region (8).

3. A semiconductor device as claimed in claim 2, characterized in that the third connection region (9) is interrupted at the location of the further sub-conductor (5).

4. A semiconductor device as claimed in claim 1, characterized in that the third connection region (9) is divided into two or more sub-regions, and the second connection region (8) is divided into one or more further sub-regions situated between the sub-regions of the third connection region (9).

5. A semiconductor device as claimed in claim 1, characterized in that the second connection conductor (5) and the third connection conductor (6) each have a comb-shaped structure at the location of the active region (A), which structures mesh together, and the longitudinal direction of the transmission line (T) extends substantially perpendicularly to the longitudinal direction of the comb-shaped structure.

6. A semiconductor device as claimed in claim 1, characterized in that the semiconductor body (10) is interrupted at the location of the second and the third connection conductor (5, 6) or it is so far removed from the second and the third connection conductor (5, 6) that the losses of the transmission line (T) are minimal.

7. A semiconductor device as claimed in claim 1, characterized in that the semiconductor body (10) is attached, by means of an adhesive layer (30), to an insulating substrate (40) and comprises at least three mesa-shaped parts (11, 12, 13) which comprise, respectively, the active region (A), the first connection conductor (4) and the first connection region (7), the second connection region (8) and the third connection region (9).

* * * * *